(12) United States Patent
Lu et al.

(10) Patent No.: US 8,724,363 B2
(45) Date of Patent: May 13, 2014

(54) ANTI-FUSE MEMORY ULTILIZING A COUPLING CHANNEL AND OPERATING METHOD THEREOF

(75) Inventors: Hau-Yan Lu, Kaohsiung (TW); Hsin-Ming Chen, Hsinchu (TW); Ching-Sung Yang, Hsinchu (TW)

(73) Assignee: eMemory Technology Inc., Hsinchu (TW)

( * ) Notice: Subject to any disclaimer, the term of this patent is extended or adjusted under 35 U.S.C. 154(b) by 126 days.

(21) Appl. No.: 13/413,626

(22) Filed: Mar. 6, 2012

(65) Prior Publication Data

US 2013/0010518 A1    Jan. 10, 2013

Related U.S. Application Data

(60) Provisional application No. 61/504,248, filed on Jul. 4, 2011.

(51) Int. Cl.
  *G11C 17/00*    (2006.01)
(52) U.S. Cl.
  USPC ........................................................... 365/94
(58) Field of Classification Search
  USPC ........................................................... 365/94
  See application file for complete search history.

(56) References Cited

U.S. PATENT DOCUMENTS

| | | | |
|---|---|---|---|
| 6,549,483 B2 * | 4/2003 | Kurjanowicz et al. | ... 365/230.03 |
| 6,667,902 B2 | 12/2003 | Peng | |
| 7,349,281 B2 * | 3/2008 | Kouchi et al. | ............. 365/225.7 |
| 7,755,162 B2 | 7/2010 | Kurjanowicz et al. | |
| 2010/0220511 A1 * | 9/2010 | Kurjanowicz | ................... 365/96 |
| 2012/0211841 A1 * | 8/2012 | Kurjanowicz | ................. 257/369 |

* cited by examiner

*Primary Examiner* — Huan Hoang
*Assistant Examiner* — Min Huang
(74) *Attorney, Agent, or Firm* — Jianq Chyun IP Office

(57) ABSTRACT

An anti-fuse memory with coupling channel is provided. The anti-fuse memory includes a substrate of a first conductive type, a doped region of a second conductive type, a coupling gate, a gate dielectric layer, an anti-fuse gate, and an anti-fuse layer. The substrate has an isolation structure. The doped region is disposed in the substrate. A channel region is defined between the doped region and the isolation structure. The coupling gate is disposed on the substrate between the doped region and the isolation structure. The coupling gate is adjacent to the doped region. The gate dielectric layer is disposed between the coupling gate and the substrate. The anti-fuse gate is disposed on the substrate between the coupling gate and the isolation structure. The anti-fuse gate and the coupling gate have a space therebetween. The anti-fuse layer is disposed between the anti-fuse gate and the substrate.

8 Claims, 6 Drawing Sheets

ANTI-FUSE MEMORY ULTILIZING A COUPLING CHANNEL AND OPERATING METHOD THEREOF

CROSS-REFERENCE TO RELATED APPLICATION

This application claims the priority benefits of U.S. provisional application Ser. No. 61/504,248, filed on Jul. 4, 2011. The entirety of the above-mentioned patent applications is hereby incorporated by reference herein and made a part of this specification.

BACKGROUND OF THE INVENTION

1. Field of the Invention

The invention relates to a semiconductor device and more particularly to an anti-fuse memory utilizing a coupling channel and an operating method thereof.

2. Description of Related Art

Non-volatile memory devices are capable of saving stored data after the power is turned off and thus have become a type of memory device widely adopted in personal computers and electronic apparatuses.

Generally, non-volatile memories can be categorized into erasable programmable ROM (EPROM), electrically erasable programmable ROM (EEPROM), mask ROM, one time programmable ROM (OTPROM), and so on.

Since EPROM and EEPROM are both capable of writing and erasing, they are the favorable choices in practical application. However, EPROM and EEPROM have more complicated fabrications which lead to higher fabrication costs.

In terms of mask ROM, although having simple fabrication and lower costs, mask ROM still needs a photo mask to define the data to be written and therefore has more limitations in usage.

In terms of OTPROM, since the data can be written after the memory is fabricated from the factory, that is, the data can be written by the user according to the environment that the memory is disposed in, OTPROM is more convenient comparing to mask ROM in usage. Recently, OTPROM has become an indispensable device in semiconductor integrated circuit apparatuses.

The anti-fuse memory device is an OTPROM widely applied in personal computers and electronic apparatuses. By applying a voltage for the current to flow through the junction of the anti-fuse layer, the dopant is shifted so that the anti-fuse layer breakdown (blown) to form a conductive path.

However, with the development in the integrated circuit industry, the industry all focuses on fabricating products with faster processing speed and smaller size. Accordingly, the integration of memory devices must be increasing continuously. Nevertheless, the decrease in line width usually leads to current leakage between memory cells, thereby affecting the operation of the memory. These issues cause the memory to result in data misinterpretation so as to lower the reliability of the memory. As a consequence, researchers now work to develop memories having high integration and high reliability.

SUMMARY OF THE INVENTION

The invention relates to an anti-fuse memory utilizing a coupling channel and an operating method thereof, wherein a coupling gate structure is used to separate an anti-fuse structure and a doped region (bit line). When a programming or reading operation is performed to an anti-fuse memory cell, a voltage is applied to a coupling gate and an anti-fuse gate so as to form a coupling channel in a substrate between the anti-fuse gate and the coupling gate through a fringe field effect. Consequently, a channel region in the anti-fuse memory cell is turned on and a location of a breakdown of an anti-fuse layer can be controlled to prevent current leakage.

The invention is directed to an anti-fuse memory utilizing a coupling channel. The anti-fuse memory includes a substrate, a first doped region of a second conductive type, a coupling gate, a gate dielectric layer, an anti-fuse gate, and an anti-fuse layer. The substrate has an isolation structure therein. The first doped region is disposed in the substrate, where a channel region is defined between the first doped region and the isolation structure. The coupling gate is disposed on the substrate between the first doped region and the isolation structure. The coupling gate is adjacent to the doped region. The gate dielectric layer is disposed between the coupling gate and the substrate. The anti-fuse gate is disposed on the substrate between the coupling gate and the isolation structure. The anti-fuse gate and the coupling gate have a space therebetween. The anti-fuse layer is disposed between the anti-fuse gate and the substrate.

In one embodiment of the invention, the substrate is a substrate of a first conductive type, the coupling channel between the coupling gate and the anti-fuse gate is formed by the substrate of the first conductive type.

In one embodiment of the invention, the first doped region is disposed in a well region of the first conductive type and a portion of the well region is disposed below the coupling gate.

In one embodiment of the invention, the anti-fuse memory utilizing the coupling channel further includes a second doped region of the second conductive type. The second doped region is disposed between the first doped region and the coupling gate. The second doped region of the second conductive type is selected form a group consisting of a source/drain extension, a double diffused region and a lightly doped drain.

In one embodiment of the invention, the anti-fuse memory utilizing the coupling channel further includes a pocket doped region. The pocket doped region is disposed below the second doped region.

In one embodiment of the invention, a portion of the anti-fuse gate is disposed on the isolation structure.

In one embodiment of the invention, the anti-fuse memory utilizing the coupling channel further includes a spacer. The spacer is disposed on sidewalls of the coupling gate and the anti-fuse gate. The space between the coupling gate and the anti-fuse gate is filled with the spacer or not.

In one embodiment of the invention, a length of the space is less than 1 micrometer (μm).

In one embodiment of the invention, the first conductive type is a P type and the second conductive type is an N type; the first conductive type is an N type and the second conductive type is a P type.

In one embodiment of the invention, the substrate is a substrate of the second conductive type, a first well of a first conductive type is disposed in the substrate of the second conductive type, the coupling channel between the coupling gate and the anti-fuse gate is formed by the first well of the first conductive type.

The invention is directed to an operating method of an anti-fuse memory utilizing a coupling channel. The anti-fuse memory includes: a doped region disposed in a substrate having an isolation structure, where a channel region is defined between the doped region and the isolation structure; and a coupling gate and an anti-fuse gate disposed on the substrate between the doped region and the isolation structure, the coupling gate is adjacent to the doped region and the anti-fuse gate and the coupling gate having a space therebetween. The operating method of the anti-fuse memory includes the following steps.

A first voltage is applied to the coupling gate, a second voltage is applied to the anti-fuse gate, and a third voltage is applied to the doped region in a programming operation. The first voltage and the second voltage are high enough to generate a fringe field effect to form a coupling channel between the anti-fuse gate and the coupling gate so as to turn on the channel region. A voltage difference between the second voltage and the third voltage is large enough for an anti-fuse layer below the anti-fuse gate to breakdown.

In one embodiment of the invention, a voltage difference between the first voltage and the third voltage is not high enough for a gate dielectric layer below the coupling gate to breakdown.

In one embodiment of the invention, the first voltage is half of the second voltage.

In one embodiment of the invention, the operating method of the anti-fuse memory utilizing the coupling channel further includes the following. A fourth voltage is applied to the coupling gate, a fifth voltage is applied to the anti-fuse gate, and a sixth voltage is applied to the doped region in a reading operation. The fourth voltage and the fifth voltage are high enough to generate a fringe field effect to form the coupling channel between the anti-fuse gate and the coupling gate so as to turn on the channel region.

The invention is directed to an operating method of an anti-fuse memory utilizing a coupling channel. The anti-fuse memory includes: a plurality of memory cells arranged in an array, each of the memory cells having a doped region, a coupling gate, and an anti-fuse gate, where the doped region is disposed in a substrate having an isolation structure, and a channel region is defined between the doped region and the isolation structure, the coupling gate and the anti-fuse gate are disposed on the substrate between the doped region and the isolation structure, the coupling gate is adjacent to the doped region, and the anti-fuse gate and the coupling gate have a space therebetween; a plurality of coupling gate lines connected to the coupling gates of the memory cells in the row direction respectively; a plurality of anti-fuse gate lines connected to the anti-fuse gates of the memory cells in the row direction respectively; a plurality of bit lines connected to the doped regions of the memory cells in the column direction respectively. The operating method of the anti-fuse memory includes the following steps.

A first voltage is applied to a selected coupling gate line connected to a selected memory cell, a second voltage is applied to a selected anti-fuse gate line connected to the selected memory cell, and a third voltage is applied to a selected bit line connected to the selected memory cell in a programming operation. The first voltage and the second voltage are high enough to generate a fringe field effect to form a coupling channel between the anti-fuse gate and the coupling gate so as to turn on the channel region of the selected memory cell. A voltage difference between the second voltage and the third voltage is large enough for an anti-fuse layer below the anti-fuse gate of the selected memory cell to breakdown.

In one embodiment of the invention, a voltage difference between the first voltage and the third voltage is not high enough for a gate dielectric layer below the coupling gate of the selected memory cell to breakdown.

In one embodiment of the invention, the first voltage is half of the second voltage.

In one embodiment of the invention, the operating method of the anti-fuse memory utilizing the coupling channel further includes the following. A fourth voltage is applied to a plurality of unselected bit lines in the programming operation to inhibit a programming of the unselected memory cells sharing the selected coupling gate line and the selected anti-fuse gate line with the selected memory cell.

In one embodiment of the invention, the fourth voltage is half of the second voltage.

In one embodiment of the invention, the operating method of the anti-fuse memory utilizing the coupling channel further includes the following. A fifth voltage is applied to the selected coupling gate line connected to the selected memory cell, a sixth voltage is applied to the selected anti-fuse gate line connected to the selected memory cell, and a seventh voltage is applied to the selected bit line connected to the selected memory cell in an reading operation. The fifth voltage and the sixth voltage are high enough to generate a fringe field effect to form the coupling channel between the anti-fuse gate and the coupling gate of the selected memory cell so as to turn on the channel region of the selected memory cell.

In the anti-fuse memory utilizing the coupling channel and the operating method thereof in the invention, the coupling gate structure is utilized to separate the anti-fuse structure and the doped region (bit line). A voltage is applied to the coupling gate and the anti-fuse gate when performing a programming or reading operation to the anti-fuse memory cell so as to form the coupling channel in the substrate between the anti-fuse gate and the coupling gate through the fringe field effect. Accordingly, the channel region of the memory cell is turned on and the location of the breakdown of the anti-fuse layer can be controlled to prevent current leakage.

In order to make the aforementioned and other features and advantages of the invention more comprehensible, several embodiments accompanied with figures are described in detail below.

BRIEF DESCRIPTION OF THE DRAWINGS

The accompanying drawings are included to provide further understanding, and are incorporated in and constitute a part of this specification. The drawings illustrate embodiments and, together with the description, serve to explain the principles of the invention.

DESCRIPTION OF EMBODIMENTS

Figure 1A:
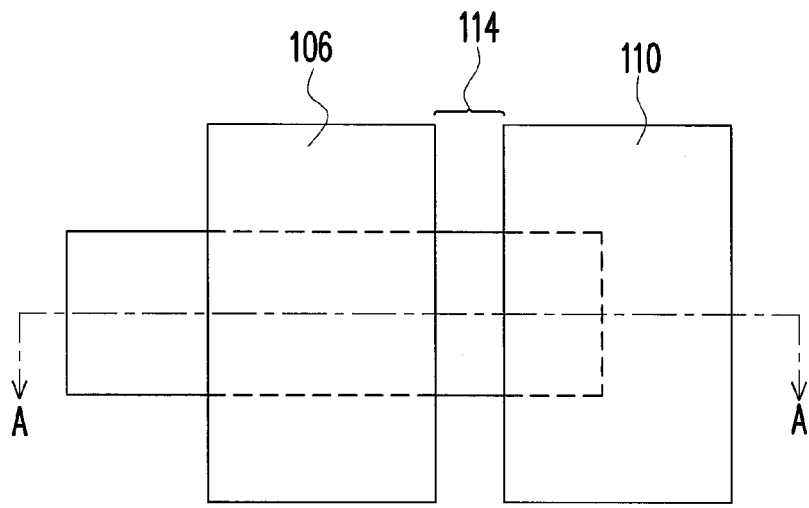
FIG. 1A illustrates a top view of an anti-fuse memory cell according to an embodiment of the invention.
Figure 1B:
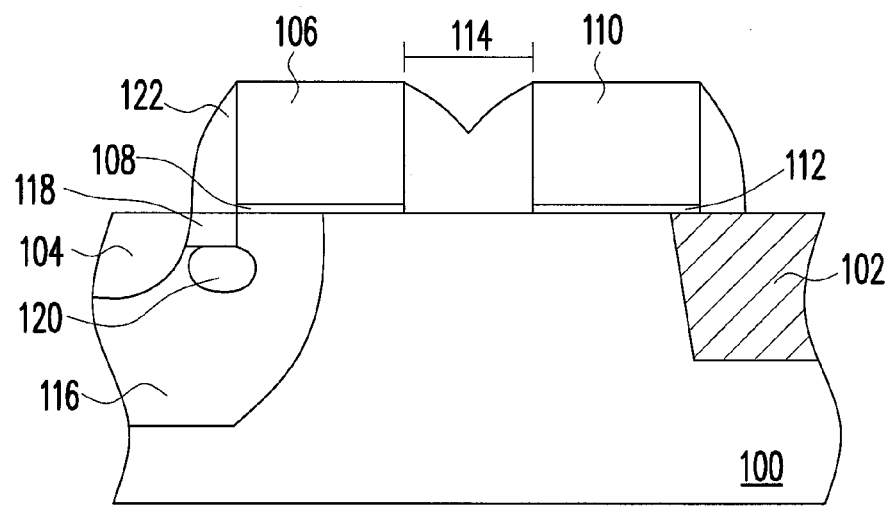
FIG. 1B shows a cross-sectional view of an anti-fuse memory cell according to an embodiment of the invention taken along line A-A' in FIG. 1A.

An anti-fuse memory utilizing a coupling channel in the invention includes a plurality of memory cell arrays. Each of the memory cell arrays is constituted by a plurality of memory cells arranged in a column/row array. Firstly, a memory cell of the invention is illustrated FIG. 1A illustrates a top view of an anti-fuse memory cell utilizing a coupling channel according to an embodiment of the invention. FIG. 1B shows a cross-sectional view taken along line A-A' in FIG. 1A.

Referring to FIG. 1A and FIG. 1B, an anti-fuse memory cell utilizing a coupling channel is disposed on a substrate 100, for example. The substrate 100 is, for example, a substrate of a first conductive type. In addition, an isolation structure 102 is disposed in the substrate 100, for instance, to define an active area. The isolation structure 102 is a shallow trench isolation structure or a field oxide layer, for example.

The anti-fuse memory cell utilizing the coupling channel includes a doped region 104 of a second conductive type, a coupling gate 106, a gate dielectric layer 108, an anti-fuse gate 110, and an anti-fuse layer 112.

The doped region 104 is disposed in the substrate 100. A channel region is defined between the doped region 104 and the isolation structure 102.

The coupling gate 106 is disposed on the substrate 100 between the doped region 104 and the isolation structure 102, for example. The coupling gate 106 is adjacent to the doped region 104. A material of the coupling gate 106 includes doped polysilicon, for instance. The coupling gate 106 is configured to form a coupling channel in the substrate 100 between the anti-fuse gate 110 and the coupling gate 106.

The gate dielectric layer 108 is disposed between the coupling gate 106 and the substrate 100, for instance. A material of the gate dielectric layer 108 includes, for example, silicon oxide. The coupling gate 106 and the gate dielectric layer 108 constitute a coupling gate structure.

The anti-fuse gate 110 is disposed on the substrate 100 between the coupling gate 106 and the isolation structure 102. The anti-fuse gate 110 and the coupling gate 106 have a space 114 therebetween. Here, a length of the space 114 is less than 1 micrometer (mm). A doped region is not formed in the substrate 100 between the anti-fuse gate 110 and the coupling gate 106. In one embodiment, a portion of the anti-fuse gate 110 is disposed on the isolation structure 102, for instance.

The anti-fuse layer 112 is disposed between the anti-fuse gate 110 and the substrate 100. A material of the anti-fuse layer 112 includes silicon oxide, for instance. The anti-fuse gate 110 and the anti-fuse layer 112 constitute an anti-fuse structure.

In the anti-fuse memory cell of the invention, a well region 116 of the first conductive type can be disposed according to needs. The doped region 104 is, for example, disposed in the well region 116 and a portion of the well region 116 is disposed below the coupling gate 106.

In the anti-fuse memory cell of the invention, a doped region 118 of the second conductive type can be disposed according to needs. The doped region 118 is disposed between the doped region 104 and the coupling gate 106, for example. The second doped region 118 of the second conductive type is selected form a group consisting of a source/drain extension, a double diffused region and a lightly doped drain.

In the anti-fuse memory cell of the invention, a pocket doped region 120 can be disposed according to needs. The pocket doped region 120 is disposed below the doped region 118.

In the anti-fuse memory cell of the invention, a spacer 122 can be disposed according to needs. The spacer 122 is disposed on a sidewall of the coupling gate 106 and the anti-fuse gate 110. Further, the spacer 122 fills the space 114 between the coupling gate 106 and the anti-fuse gate 110.

In the embodiment, the first conductive type is a P type and the second conductive type is an N type; and the first conductive type is an N type and the second conductive type is a P type.

Figure 1C:
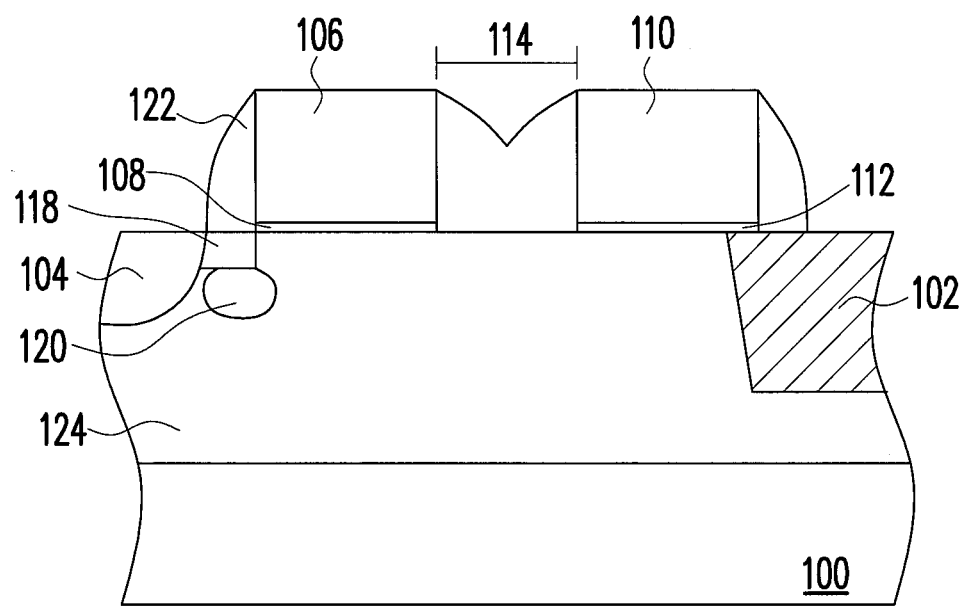
FIG. 1C shows a cross-sectional view of an anti-fuse memory cell according to another embodiment of the invention taken along line A-A' in FIG. 1A.

FIG. 1C illustrates a cross-sectional view of an anti-fuse memory cell utilizing a coupling channel according to another embodiment of the invention.

Referring to FIG. 1C, an anti-fuse memory cell utilizing a coupling channel is disposed on a substrate 100, for example. The substrate 100 is, for example, a substrate of a first conductive type. A well 124 of a first conductive type is disposed in the substrate 100. In addition, an isolation structure 102 is disposed in the substrate 100, for instance, to define an active area.

The anti-fuse memory cell utilizing the coupling channel includes a doped region 104 of a second conductive type, a coupling gate 106, a gate dielectric layer 108, an anti-fuse gate 110, and an anti-fuse layer 112.

The doped region 104 is disposed in the well 124. A channel region is defined between the doped region 104 and the isolation structure 102.

The coupling gate 106 is disposed on the substrate 100 between the doped region 104 and the isolation structure 102, for example. The coupling gate 106 is adjacent to the doped region 104. A material of the coupling gate 106 includes doped polysilicon, for instance. The coupling gate 106 is configured to form a coupling channel in the substrate 100 between the anti-fuse gate 110 and the coupling gate 106.

The gate dielectric layer 108 is disposed between the coupling gate 106 and the well 124, for instance. A material of the gate dielectric layer 108 includes, for example, silicon oxide. The coupling gate 106 and the gate dielectric layer 108 constitute a coupling gate structure.

The anti-fuse gate 110 is disposed on the well 124 between the coupling gate 106 and the isolation structure 102. The anti-fuse gate 110 and the coupling gate 106 have a space 114 therebetween. Here, a length of the space 114 is less than 1 micrometer (μm). A doped region is not formed in the substrate 100 between the anti-fuse gate 110 and the coupling gate 106. In one embodiment, a portion of the anti-fuse gate 110 is disposed on the isolation structure 102, for instance.

The anti-fuse layer 112 is disposed between the anti-fuse gate 110 and the well 124. A material of the anti-fuse layer 112 includes silicon oxide, for instance. The anti-fuse gate 110 and the anti-fuse layer 112 constitute an anti-fuse structure.

In the anti-fuse memory cell of the invention, a doped region 118 of the second conductive type can be disposed according to needs. The doped region 118 is disposed between the doped region 104 and the coupling gate 106, for example. The second doped region 118 of the second conductive type is selected form a group consisting of a source/drain extension, a double diffused region and a lightly doped drain.

In the anti-fuse memory cell of the invention, a pocket doped region 120 can be disposed according to needs. The pocket doped region 120 is disposed below the light-doped region 118.

In the anti-fuse memory cell of the invention, a spacer 122 can be disposed according to needs. The spacer 122 is disposed on a sidewall of the coupling gate 106 and the anti-fuse gate 110. Further, the spacer 122 fills the space 114 between the coupling gate 106 and the anti-fuse gate 110 or not.

In the embodiment, the first conductive type is a P type and the second conductive type is an N type; and the first conductive type is an N type and the second conductive type is a P type.

In the anti-fuse memory cell of the invention, there is no doped region formed in the substrate 100 between the anti-fuse gate 110 and the coupling gate 106. In the manufacturing process of the anti-fuse memory cell of the invention, as shown in FIG. 1A, a block layer 126 (N+block layer and/or P+block layer and a LDD block layer) is used, so that there is no dopant implanted into the substrate 100 between the anti-fuse gate 110 and the coupling gate 106. The material of the coupling channel region between the anti-fuse gate 110 and the coupling gate 106 is kept the same as the substrate 100 and well 124. The N+block layer and/or P+block layer are use for blocking N+ and/or P+ dopant when a N+ and/or P+ implantation is performed, so that N+ and/or P+ dopant is not implanted into the substrate 100 between the anti-fuse gate 110 and the coupling gate 106. The LDD block layer is use for blocking dopant when a LDD implantation is performed, so that dopant is not implanted into the substrate 100 between the anti-fuse gate 110 and the coupling gate 106. The coupling channel between the anti-fuse gate 110 and the coupling gate 106 is formed by the substrate 100 (as shown in FIG. 1B) or the well 124 (as shown in FIG. 1C).

In the anti-fuse memory cell of the invention, the coupling gate structure is utilized to separate the anti-fuse structure and the doped region 104 (bit line). A voltage is applied to the coupling gate 106 and the anti-fuse gate 110 when performing a programming or reading operation to the anti-fuse memory cell so as to form the coupling channel in the substrate 100 between the anti-fuse gate 110 and the coupling gate 106 through the fringe field effect. Accordingly, the channel region of the memory cell is turned on and the location of the breakdown of the anti-fuse layer 112 can be controlled to prevent leakage current.

When the programming operation is performed to the anti-fuse memory cell, the voltage applied to the coupling gate 106 must not be high enough for the gate dielectric layer 108 to breakdown; however, the voltage applied to the anti-fuse gate 110 must be high enough for the anti-fuse layer 112 to breakdown. When the gate dielectric layer 108 and the anti-fuse layer 112 have the same material and thickness, then the voltage applied to the coupling gate 106 must be lower than the voltage applied to the anti-fuse gate 110 so that the gate dielectric layer 108 does not breakdown. On the other hand, when the gate dielectric layer 108 and the anti-fuse layer 112 are fabricated with the same material, then the thickness of the gate dielectric layer 108 can be increased such that the gate dielectric layer 108 does not breakdown even when the voltage applied on the coupling gate 106 equals to the voltage applied on the anti-fuse gate 110.

Figure 2:
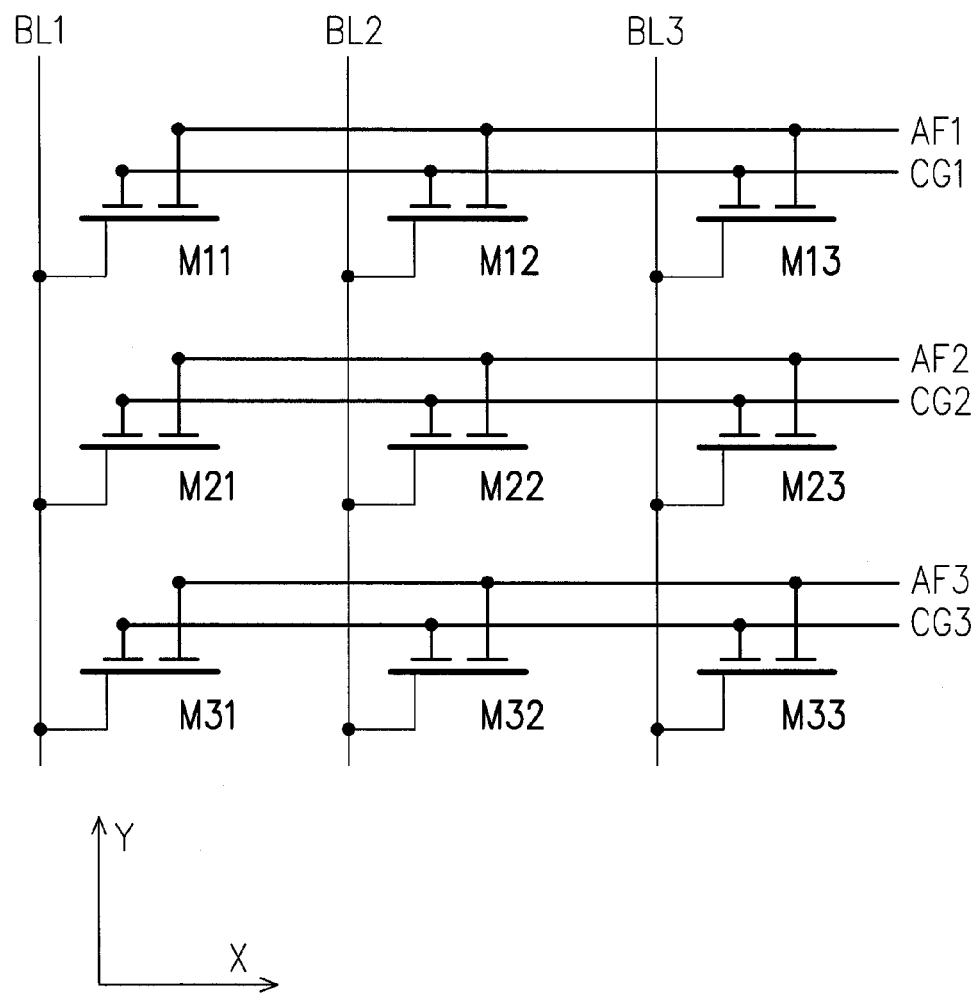
FIG. 2 illustrates an electrical schematic diagram of an anti-fuse memory array according to an embodiment of the invention.

FIG. 2 shows an electrical schematic diagram of an anti-fuse memory array utilizing a coupling channel according to an embodiment of the invention.

Referring to FIG. 2, the anti-fuse memory utilizing the coupling channel in the invention is constituted by a plurality of memory cell arrays, for example. The memory cell arrays are illustrated in the following. In the present embodiment, a memory cell array constituted by 3*3 memory cells is used as an example for illustration. However, the number of memory cells adopted for constituting the memory cell array can be altered according to actual circumstances. For example, the memory cell array can be constituted by 64, 256, 512 memory cells and so on. In FIG. 2, an X direction is defined as a column direction and a Y direction is defined as a row direction.

The memory cell array includes a plurality of memory cells M11-M33, a plurality of coupling gate lines CG1-CG3, a plurality of anti-fuse gate lines AF1-AF3, and a plurality of bit lines BL1-BL3.

Each of the memory cells M11-M33 has a structure as illustrated in FIGS. 1A and 1B and the details are thus not reiterated hereinafter.

The coupling gate lines CG1-CG3 are disposed on the substrate in parallel and extend along the column direction (the X direction). The coupling gate lines CG1-CG3 are connected to the coupling gates of the memory cells in the row direction respectively. For example, the coupling gate line CG1 is connected to the coupling gates of the memory cells M11-M13; the coupling gate line CG2 is connected to the coupling gates of the memory cells M21-M23; the coupling gate line CG3 is connected to the coupling gates of the memory cells M31-M33.

The anti-fuse gate lines AF1-AF3 are disposed on the substrate in parallel and extend along the column direction (the X direction). The anti-fuse gate lines AF1-AF3 are connected to the anti-fuse gates of the memory cells in the row direction respectively. For instance, the anti-fuse gate line AF1 is connected to the anti-fuse gates of the memory cells M11-M13; the anti-fuse gate line AF2 is connected to the anti-fuse gates of the memory cells M21-M23; the anti-fuse gate line AF3 is connected to the anti-fuse gates of the memory cells M31-M33.

The bit lines BL1-BL3 are disposed on the substrate in parallel and extend along the column direction (the Y direction). The bit lines BL1-BL3 are connected to the doped regions of the memory cells in the same row respectively. For example, the bit line BL1 is connected to the doped regions of the memory cells M11-M31; the bit line BL2 is connected to the doped regions of the memory cells M12-M32; the bit line BL3 is connected to the doped regions of the memory cells M13-M33.

In the following, an operating method of an anti-fuse memory in the invention is described. The operating method includes operation modes such as programming, data reading, and so on. An embodiment of the operating method of the anti-fuse memory is provided below for illustration. However, the operating method of the anti-fuse memory array in the invention is not limited to these methods. In the illustration, the memory cell M13 in the diagram is used as an example.

Figure 3A:
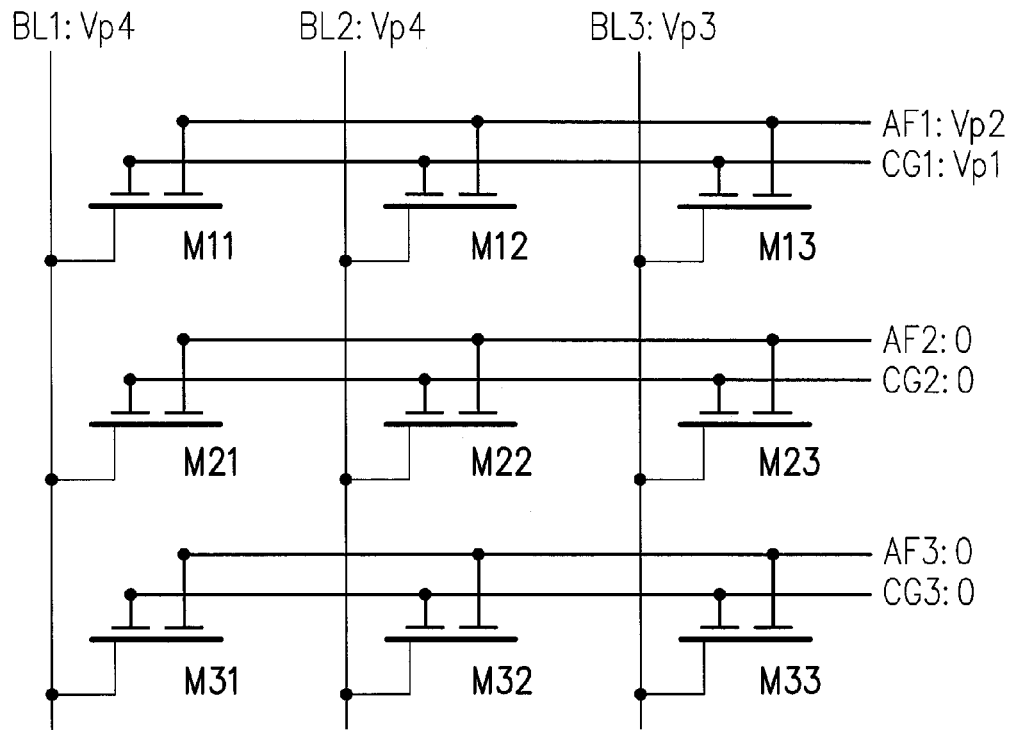
FIG. 3A is a schematic diagram illustrating a programming operation in an anti-fuse memory array according to an embodiment of the invention.
Figure 3B:
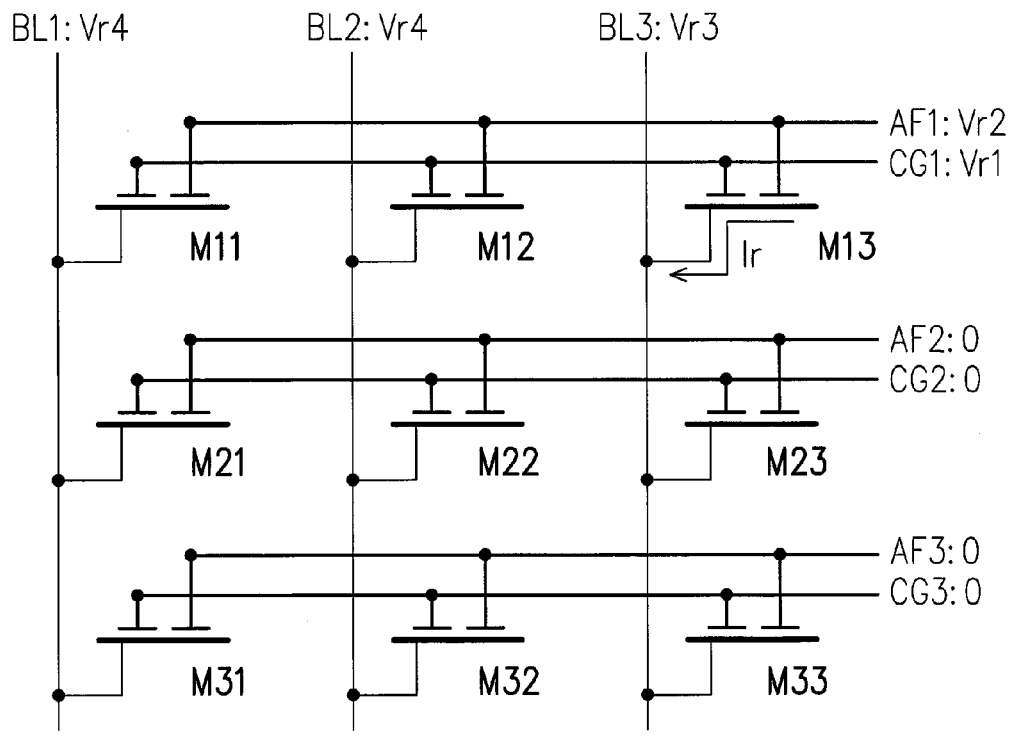
FIG. 3B is a schematic diagram illustrating a reading operation in an anti-fuse memory array according to an embodiment of the invention.
Figure 4A:
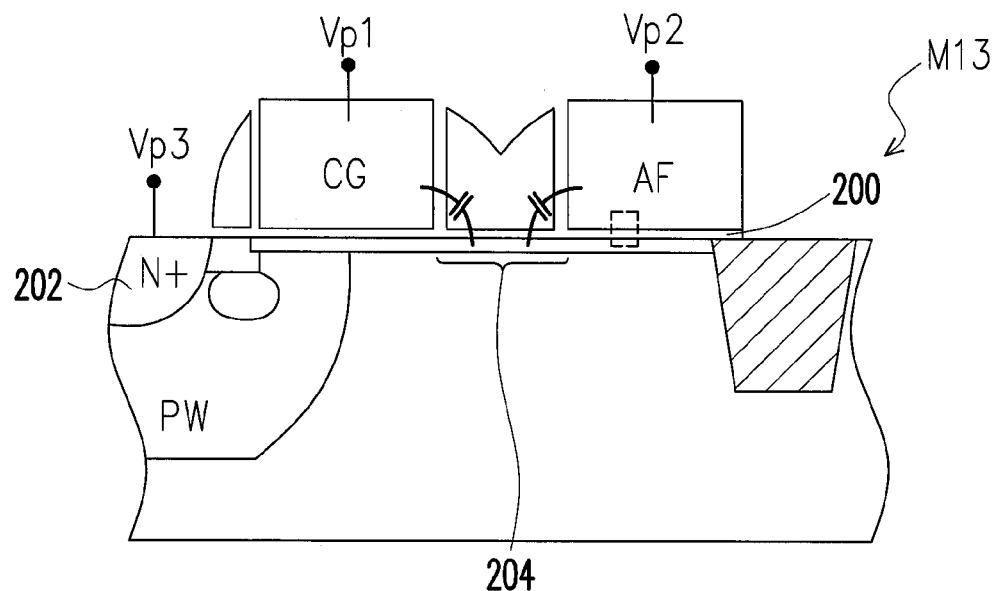
FIG. 4A depicts a schematic cross-sectional view of a selected memory cell M13 during a programming operation.
Figure 4B:
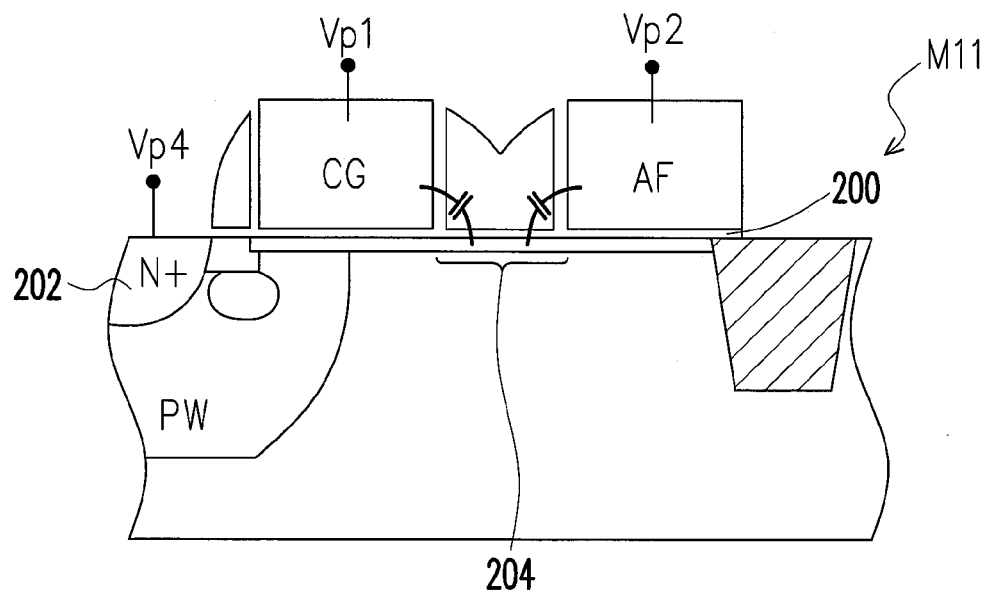
FIG. 4B shows a schematic cross-sectional view of an unselected memory cell M11 during a programming operation.
Figure 4C:
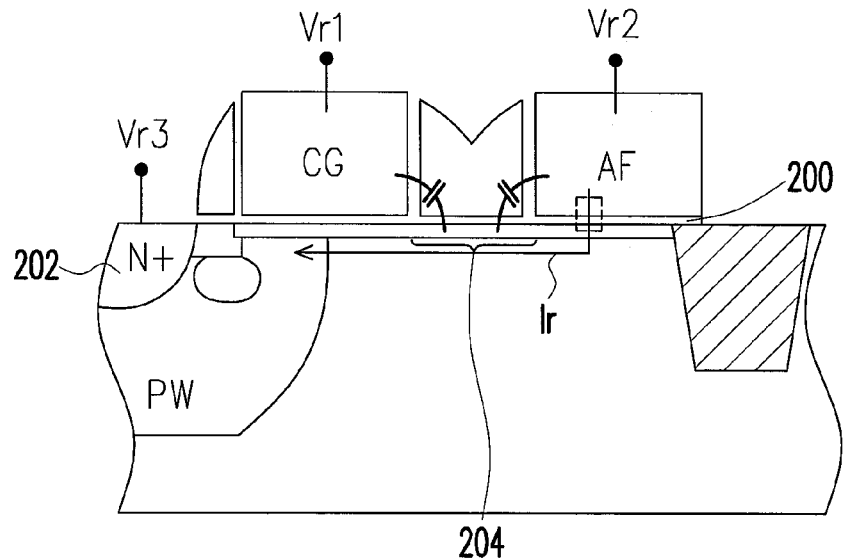
FIG. 4C depicts a schematic cross-sectional view of the selected memory cell M13 during an reading operation.

FIGS. 3A and 3B respectively depict a schematic diagram of a programming operation and a reading operation of the memory cell array in one embodiment. FIG. 4A shows a schematic cross-sectional view of a selected memory cell M13 during a programming operation. FIG. 4B shows a schematic cross-sectional view of an unselected memory cell M11 during a programming operation. FIG. 4C depicts a schematic cross-sectional view of the selected memory cell M13 during a reading operation.

Referring to FIG. 3A, when a programming operation is performed to the selected memory cell M13, a voltage Vp1 is applied to the selected coupling gate line CG1 connected to the selected memory cell M13, a voltage Vp2 is applied to the selected anti-fuse gate line AF1 connected to the selected memory cell M13, and a voltage Vp3 is applied to the selected bit line BL3 connected to the selected memory cell M13. A voltage Vp4 is applied to the unselected bit lines BL1, BL2.

The voltage Vp1 and the voltage Vp2 are high enough for generating a fringe field effect to form a coupling channel between the anti-fuse gate AF and the coupling gate CG of the selected memory cell M13 so as to turn on the channel region of the selected memory cell M13. A voltage difference between the voltage Vp2 and the voltage Vp3 is large enough for an anti-fuse layer below the anti-fuse gate AF of the selected memory cell M13 to breakdown. A voltage difference between the voltage Vp1 and the voltage Vp3 is not large enough for a gate dielectric layer below the coupling gate CG of the selected memory cell M13 to breakdown. The voltage Vp1 is half of the voltage Vp2, for example. A voltage difference between the voltage Vp2 and the voltage Vp4 is not large enough for the anti-fuse layer below the anti-fuse gate AF of the selected memory cell M13 to breakdown. The voltage Vp4 is half of the voltage Vp2, for example.

In the present embodiment, the anti-fuse layer has a thickness ranging from 4 angstrom to 40 angstrom, for example. A voltage difference between the voltage Vp2 and the voltage Vp3 ranges from 1 V to 15 V, for example. The voltage Vp1 is about 7.5 V, for instance; the voltage Vp2 is about 15 V, for example; the voltage Vp3 is about 0 V, for instance.

As shown in FIG. 4A, when programming the selected memory cell M13, the voltage Vp1 applied on the coupling gate line CG1 (the coupling gate CG) and the voltage Vp2 applied on the anti-fuse gate line AF1 (the anti-fuse gate AF) each turns on a channel below the coupling gate CG and the anti-fuse gate AF. Moreover, the voltage Vp1 applied on the coupling gate line CG1 (the coupling gate CG) and the voltage Vp2 applied on the anti-fuse gate, line AF1 (the anti-fuse gate AF) generate a fringe field effect to form a coupling channel 204 between the anti-fuse gate AF and the coupling gate CG of the selected memory cell M13. Therefore, the voltage Vp3 applied on the bit line BL3 (a doped region 202) flows through the channel below the coupling gate CG, the coupling channel 204, and the channel below the anti-fuse gate AF to reach below the anti-fuse gate AF. Thereafter, the voltage difference between the voltage Vp2 applied on the anti-fuse gate AF and the voltage Vp3 applied on the bit line BL3 (the doped region 202) leads to the breakdown of the anti-fuse layer 200 so as to program the selected memory cell M13.

When performing the programming operation, in the unselected memory cells M11 (as depicted in FIG. 4B) and M12 sharing the coupling gate line CG1 and the anti-fuse gate line AF1 with the selected memory cell M13, since a voltage difference between the voltage Vp4 applied to the unselected bit lines BL1, BL2 connected to the unselected memory cells M11, M12 and the voltage Vp2 applied on the anti-fuse gate line AF1 is not large enough for an anti-fuse layer 200 of each of the unselected memory cells M11, M12 to breakdown, the unselected memory cells M11, M12 are inhibited from being programmed.

When performing the programming operation, in the unselected memory cells M23, M33 sharing the bit line BL3 with the selected memory cell M13, the voltages applied on the unselected coupling gate lines CG2, CG3 and the anti-fuse gate lines AF2, AF3 connected to the unselected memory cells M23, M33 (which are all 0V) fail to form the coupling channel 204 between the anti-fuse gate AF and the coupling gate CG of the selected memory cell M13. That is, the channel regions of the unselected memory cells M23, M33, which are turned off. Since the anti-fuse gate AF and the substrate of the unselected memory cells M23, M33 have no voltage difference, the anti-fuse layers 200 of the unselected memory cells M23, M33 do not breakdown. In other words, the unselected memory cells M23, M33 are not programmed.

When performing the programming operation, in the unselected memory cells M21, M22, M31, M32, the voltages applied on the unselected coupling gate lines CG2, CG3 and the anti-fuse gate lines AF2, AF3 connected to the unselected memory cells M21, M22, M31, M32 (which are all 0V) fail to form the coupling channel 204 between the anti-fuse gate AF and the coupling gate CG of the selected memory cell M13. That is, the channel regions of the unselected memory cells M21, M22, M31 and M32 are turned off. Since the anti-fuse gate AF and the substrate of the unselected memory cells M21, M22, M31, M32 have no voltage difference, the anti-fuse layers 200 of the unselected memory cells M21, M22, M31, M32 do not breakdown. In other words, the unselected memory cells M21, M22, M31 and M32 are not programmed.

In the programming operation of the anti-fuse memory of the present embodiment, although the programming operation is performed in units of a single memory cell in the memory cell array, the programming operation of the anti-fuse memory can also be controlled through each of a plurality of control lines and each of a plurality of programming lines so as to program in units of bytes, segments, or partitions.

FIG. 3B is a schematic diagram illustrating a reading operation in the anti-fuse memory array according to an embodiment of the invention.

Referring to FIGS. 3B and 4C, when a reading operation is performed to the selected memory cell M13, a voltage Vr1 is applied to the selected coupling gate line CG1 connected to the selected memory cell M13, a voltage Vr2 is applied to the selected anti-fuse gate line AF1 connected to the selected memory cell M13, and a voltage Vr3 is applied to the selected bit line BL3 connected to the selected memory cell M13. A voltage Vr4 is applied to the unselected bit lines BL1, BL2. The voltage Vr1 and the voltage Vr2 are high enough for generating a fringe field effect to form the coupling channel 204 between the anti-fuse gate AF and the coupling gate CG of the selected memory cell M13 so as to turn on the channel region of the selected memory cell M13.

In the present embodiment, the voltage Vr1 ranges from 0V-5V, for example, the voltage Vr2 ranges from 0V-5V, for example; the voltage Vr3 is about 0V, for example; the voltage Vr4 is about 0V, for instance.

In the bias voltage situation aforementioned, the digital information stored in the memory cell M13 can be determined by detecting the amount of a channel current Ir of the memory cell.

Figure 5:
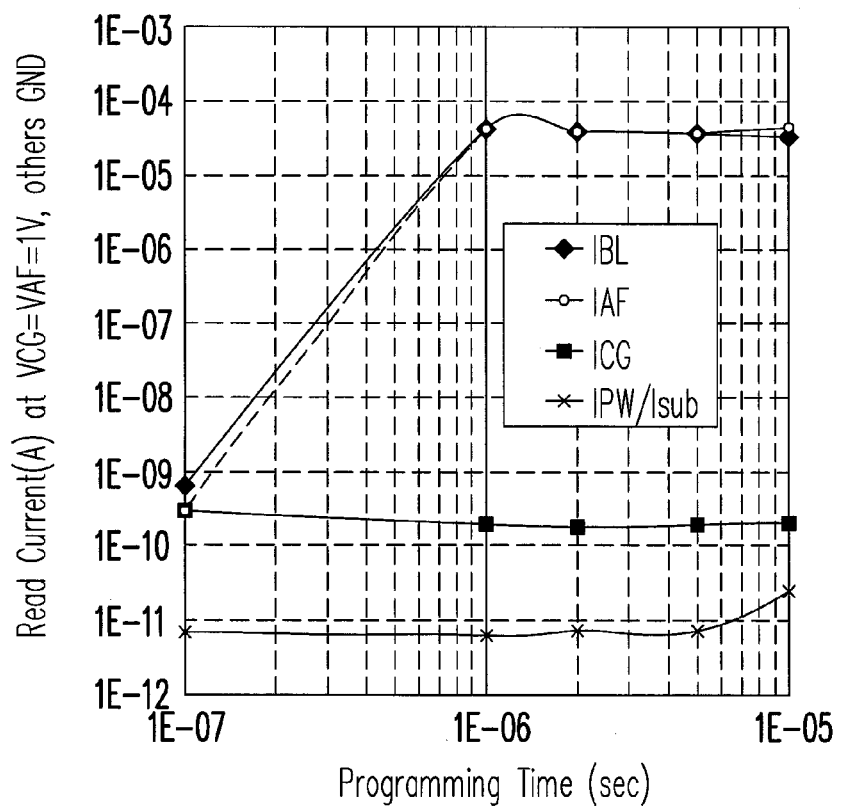
FIG. 5 depicts the program characteristics form silicon result.

FIG. 5 depicts the program characteristics form silicon result. As shown in FIG. 5, before oxide breakdown, the memory shows high impendence and no any read current. After about 1 us to 10 us programming biases stress by applying a voltage VAF (=VPP) to the anti-fuse gate AF, applying a voltage VCG (≤VPP) to the coupling gate CG, and grounding others nodes (about 0V), the gate dielectric would show low impedance at the anti-fuse gate due to hard breakdown. Thus, the OTP memory cell demonstrates a sensible reading current with reading biases.

In the operating method aforementioned, when the programming operation is performed to the selected memory cell, the voltage applied to the coupling gate and the anti-fuse gate generate a fringe field effect to form the coupling channel between the anti-fuse gate and the coupling gate of the selected memory cell so as to turn on the channel region of the selected memory cell. The voltage applied to the doped region flows through the channel below the coupling gate, the coupling channel, and the channel below the anti-fuse gate to reach below the anti-fuse gate so that the location of the breakdown of the anti-fuse layer can be controlled, thereby preventing current leakage and enhancing the reliability of the memory.

In light of the foregoing, in the anti-fuse memory and the operating method thereof in the invention, the anti-fuse structure and the doped region (the bit line) are separated using the coupling gate structure. In operation, the voltage applied at the coupling gate and the anti-fuse gate generate a fringe field effect to form the coupling channel between the anti-fuse gate and the coupling gate of the selected memory cell so as to turn on the channel region of the selected memory cell. As a consequence, the location of the breakdown of the anti-fuse layer can be controlled to prevent current leakage and enhance the reliability of the memory.

Furthermore, the operating method of the anti-fuse memory in the invention allows programming and reading in units of single memory cells, bytes, segments, or partitions through the control of each of the coupling gate lines, each of the anti-fuse gate lines, and each of the bit lines.

It will be apparent to those skilled in the art that various modifications and variations can be made to the structure of the disclosed embodiments without departing from the scope or spirit of the invention. In view of the foregoing, it is intended that the invention cover modifications and variations of this invention provided they fall within the scope of the following claims and their equivalents.

What is claimed is:

1. An anti-fuse memory ultilizing a coupling channel, comprising:
    a substrate, wherein an isolation structure is disposed in the substrate;
    a first doped region of a second conductive type disposed in the substrate, wherein a coupling channel region is defined between the first doped region and the isolation structure;
    a coupling gate disposed on the substrate between the first doped region and the isolation structure, and the coupling gate being adjacent to the doped region;
    a gate dielectric layer disposed between the coupling gate and the substrate;
    an anti-fuse gate disposed on the substrate between the coupling gate and the isolation structure, wherein the anti-fuse gate and the coupling gate have a space therebetween; and
    an anti-fuse layer disposed between the anti-fuse gate and the substrate, wherein the substrate is a substrate of a first conductive type, and the coupling channel between the coupling gate and the anti-fuse gate is formed by the substrate of the first conductive type.

2. The anti-fuse memory ultilizing the coupling channel as claimed in claim 1, wherein the first doped region is disposed in a well region of the first conductive type and a portion of the well region is disposed below the coupling gate.

3. The anti-fuse memory ultilizing the coupling channel as claimed in claim 1, the high resistance area for the coupling channel between the coupling gate and the anti-fuse gate can be reverted to low resistance area through the electrical field setup by the coupling gate or the anti-fuse gate.

4. The anti-fuse memory ultilizing the coupling channel as claimed in claim 1, wherein a portion of the anti-fuse gate is disposed on the isolation structure.

5. The anti-fuse memory ultilizing the coupling channel as claimed in claim 1, further comprising a spacer disposed on a sidewall of the coupling gate and the anti-fuse gate.

6. The anti-fuse memory ultilizing the coupling channel as claimed in claim 1, wherein a length of the space is less than 1 micrometer ($\mu$m).

7. The anti-fuse memory ultilizing the coupling channel as claimed in claim 1, wherein the first conductive type is one of P type and N type, the second conductive type is another one of P type and N type, respectively.

8. The anti-fuse memory ultilizing the coupling channel as claimed in claim 1 further comprises a well of a first conductive type disposed in the substrate of the first conductive type, and the coupling channel between the coupling gate and the anti-fuse gate is formed instead by the first well of the first conductive type.

* * * * *